United States Statutory Invention Registration [19]

[11] Reg. Number: H13

Vratny

[45] Published: Jan. 7, 1986

[54] CONNECTING A FLAT-PACK-PACKAGED CHIP TO A PRINTED CIRCUIT BOARD

[75] Inventor: Frederick Vratny, Berkeley Heights, N.J.

[73] Assignee: AT&T Bell Laboratories, Murray Hill, N.J.

[21] Appl. No.: 639,863

[22] Filed: Aug. 13, 1984

[51] Int. Cl.[4] ..... H05K 1/00

[52] U.S. Cl. ..... 339/17 CF; 339/17 R

[58] Field of Search ..... 339/17 CF, 174, 176 M, 339/176 MP, 278 C; 174/52 FP

[56] References Cited

U.S. PATENT DOCUMENTS

| | | | |
|---|---|---|---|
| 3,942,855 | 3/1976 | de Villemur | 339/278 C |
| 3,951,495 | 4/1976 | Donaher et al. | 339/17 CF |
| 4,427,247 | 1/1984 | Petersen | 339/17 CF |
| 4,427,249 | 1/1984 | Bright | 339/17 CF |

OTHER PUBLICATIONS

IBM Bulletin, DeBoskey, vol. 15, No. 1, p. 307, 6-1972.

*Primary Examiner*—S. C. Buczinski

*Assistant Examiner*—Linda J. Wallace

*Attorney, Agent, or Firm*—Lucian C. Canepa

[57] ABSTRACT

A unique socket assembly is designed to interconnect a flat-pack-packaged integrated-circuit chip to a printed-circuit board in a manner that permits easy insertion and withdrawal of the packaged chip from the assembly. A base portion of the assembly includes a recess into which conductive cantilevered elements extend. When the packaged chip is positioned on these elements within the recess and a lid is placed on the base, secure but not permanent electrical contact is established between the elements and contact regions on the chip package.

9 Claims, 6 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

CONNECTING A FLAT-PACK-PACKAGED CHIP TO A PRINTED CIRCUIT BOARD

BACKGROUND OF THE INVENTION

This invention relates to the packaging of integrated-circuit chips and, more particularly, to an assembly for mounting a chip on a printed-circuit board.

Various solutions have been proposed to the problem of connecting a microminiature integrated-circuit chip to a standard printed-circuit board. In accordance with one approach, the chip is mounted in the recessed portion of the top side of a so-called flat-pack carrier that contains a radially extending conductive pattern. Wire bonds extend between pads on the chip and inner terminal portions of the conductive pattern. A protective material and/or a cover are typically added to the carrier to seal the mounted chip in place. After sealing, outer terminal portions of the conductive pattern on the carrier remain accessible for interconnection to an associated electrical component such as a printed-circuit board.

Several known approaches are then available for mounting the flat-pack-packaged chip on a printed-circuit board. In one approach, the carrier is placed top-side down on a board that includes a conductive pattern with solder bumps. The bumps are located to establish respective electrical contact with the outer terminal portions of the conductive pattern on the carrier. In another approach, the carrier is bonded top-side up to a printed-circuit board that includes conductive terminal portions formed on the board in the immediate vicinity of the bonded carrier. Wire bonds are then made between these terminal portions on the board and the outer terminal portions of the conductive pattern on the carrier.

For some applications, the aforementioned approaches are adequate for mounting a chip-containing carrier on a printed-circuit board. But soldered or bonded carriers on a printed-circuit board cannot easily be replaced during development and testing of the board. Additionally, the final-design version of such a board cannot easily be repaired in the field.

Accordingly, workers in the art have directed considerable efforts at trying to devise other approaches for mounting flat-pack-packaged chips on a printed-circuit board. It was recognized that such efforts, if successful, had the potential for providing an improved mounting assembly capable of lowering the cost of developing, testing and repairing equipment that includes chip carriers on a printed-circuit board.

SUMMARY OF THE INVENTION

Hence, an object of the present invention is an improved assembly for mounting a chip on a printed-circuit board. More specifically, an object of this invention is a compact assembly for mounting a flat-pack-packaged chip on a printed-circuit board in an easily replaceable manner.

Briefly, these and other objects of the present invention are realized in a specific illustrative socket assembly that is adapted to be plugged into a printed-circuit board. A multiple-pad flat pack containing a chip is mounted in the assembly in an easily removable manner that is mechanically secure and electrically stable.

The specific illustrative socket assembly made in accordance with this invention includes a frame portion defining a cavity. Multiple cantilevered terminal members extend into the cavity around the periphery thereof. The terminal members are each upwardly inclined and include a terminal edge portion designed to make sliding and slightly penetrating contact with an associated one of the pads of the flat pack when the pack is positioned face-down on the pins within the cavity. A lid portion of the assembly is designed to contact the back side of the flat pack and thereby maintain the terminal members in resilient contact with their respective pads.

The terminal members constitute the ends of conductors embedded in the frame portion of the assembly. The other ends of these conductors extend from the bottom of the frame and constitute terminals designed to be inserted into a standard socket on a conventional printed circuit board.

BRIEF DESCRIPTION OF THE DRAWING

A complete understanding of the present invention and of the above and other features thereof may be gained from a consideration of the following detailed description presented hereinbelow in connection with the accompanying drawing, not drawn to scale, in which.

DETAILED DESCRIPTION

Figure 1:
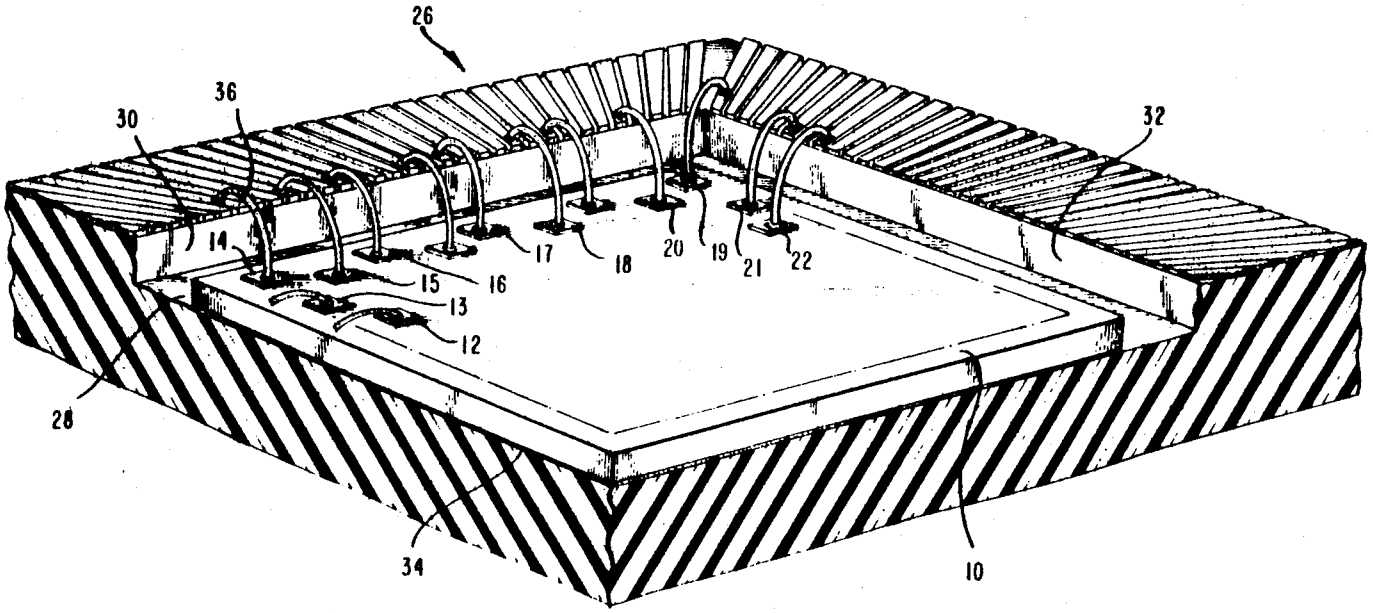
FIG. 1 (PRIOR ART)
FIGS. 1 and 2 show an integrated-circuit chip mounted on and interconnected to a standard flat-pack carrier.

A conventional integrated-circuit chip 10 is schematically represented in FIG. 1. By way of example, the chip 10 comprises a very-large-scale-integrated (VLSI) semiconductor chip measuring approximately 4.6 millimeters (mm) by 4.8 mm. A number of conductive bonding pads are included on the chip 10 around the periphery thereof, in a manner well known in the art. In one specific chip design, 132 such pads each measuring about 75 micrometers ($\mu$m) by 75 $\mu$m are formed thereon. So as not to unduly clutter the drawing, FIG. 1 explicitly shows only eleven bonding pads 12 through 22 on the chip 10.

FIG. 1 also shows a portion of a standard flat-pack chip carrier 26 made, for example, of ceramic. The carrier 26 comprises a recessed portion 28 partially defined by side walls 30 and 32. Illustratively, the bottom of the recessed portion 28 is coated with a layer of gold. The bottom of the chip 10 is bonded and established in electrical contact with the gold layer by, for example, eutectic bonding or by means of a layer 34 comprising a standard silver epoxy cement.

A portion of a conductive pattern formed on the main planar top side of the carrier 26 is shown in FIG. 1. This pattern is made, for example, of gold. Inner terminal portions of this conductive pattern extend to the edge of the previously specified recessed portion 28. Standard wire bonds interconnect the pads on the chip 10 with respective ones of these inner terminal portions. Thus, for example, wire bond 36 shown in FIG. 1 serves to connect the chip pad 14 to an associated one of the inner terminal portions of the carrier 26.

Figure 2:
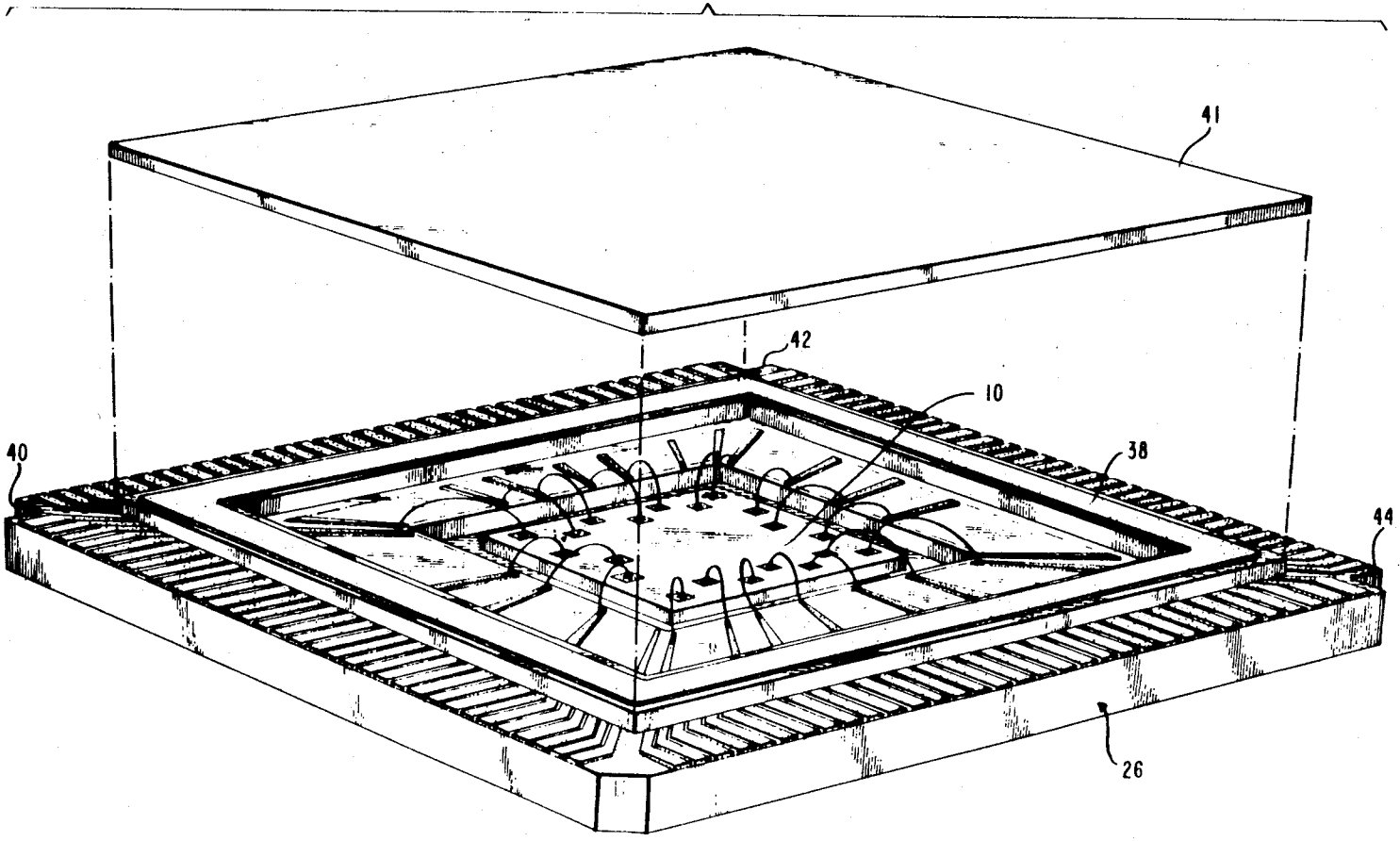
FIG. 2 (PRIOR ART)

FIG. 2 shows the entire top side of the carrier 26 including the chip 10 mounted on and interconnected thereto. The conductive pattern on the main planar top side of the carrier 26 includes multiple flat conductors each of which extends from the recessed portion 28 to the outside perimeter of the carrier. The outer terminal portions of the conductive pattern along the perimeter are adapted to be contacted by terminal members included in applicant's novel socket, as will be described in detail later below.

The carrier shown in FIG. 2 also includes a ledge portion 38. Illustratively, the portion 38 is also made of ceramic and is, for example, bonded to the main planar top side of the carrier 26 overlying portions of the aforespecified multiple flat conductors. A standard flat cover 40 is designed to be positioned on the ledge portion 38 and to be bonded thereto. In conjunction with a conventional sealing or potting material applied to the carrier 26 within the ledge portion 38, the cover 41 serves to protect the chip 10 and its associated connections from dust, moisture, etc.

As depicted in FIG. 2, three corners of the carrier 26 include cut-out regions 40, 42 and 44, respectively. As will be evident later below, these regions serve as keys to insure proper registration of the carrier 26 in applicant's novel socket assembly.

Figure 3:
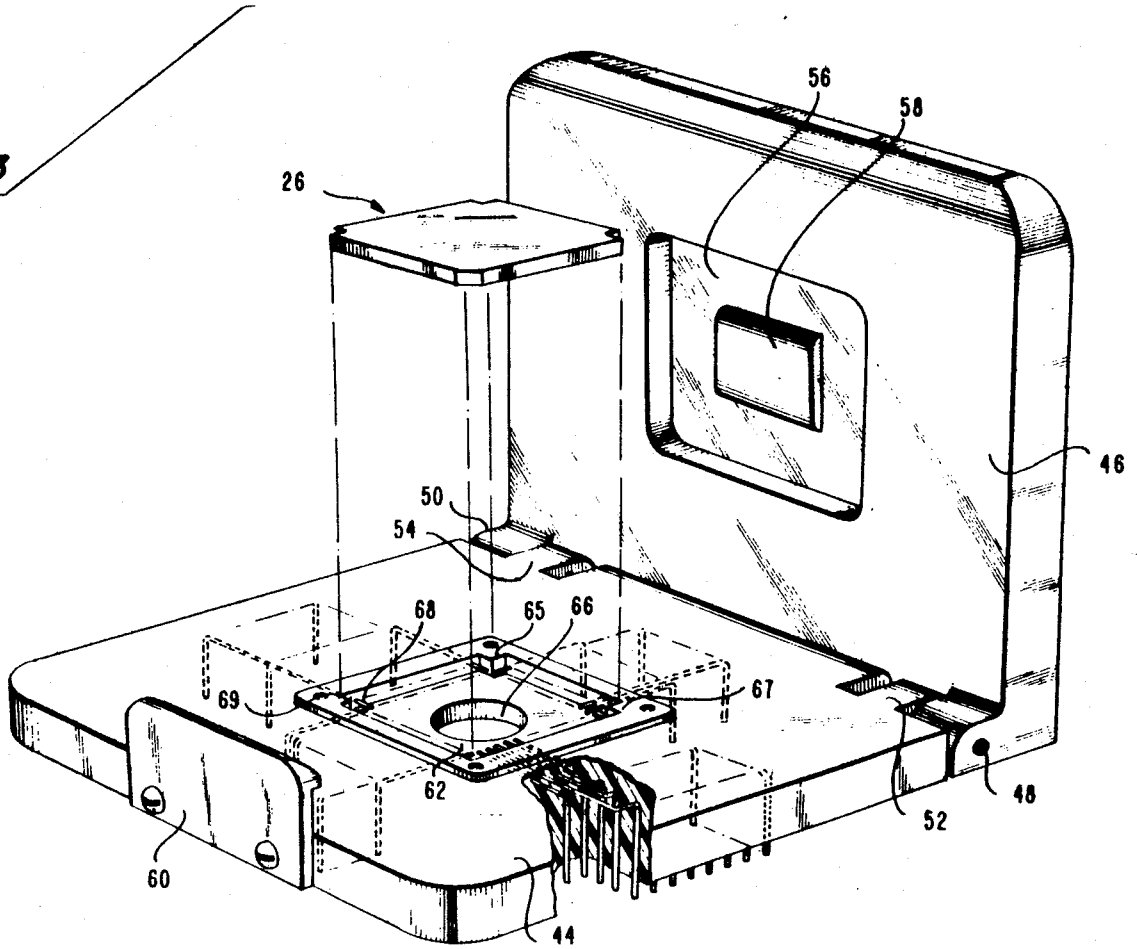
FIG. 3 depicts a specific illustrative socket assembly made in accordance with the principles of the present invention, which assembly is adapted to have the carrier of FIGS. 1 and 2 mounted therein.

A specific illustrative socket assembly made in accordance with applicant's inventive principles is depicted in FIG. 3. As shown, the socket is in its so-called open position. A chip carrier 26 of the type represented in FIGS. 1 and 2 is shown, bottom side up, lifted from its intended mounting position in contact with the base 44 of the depicted assembly.

A lid 46 (FIG. 3) is hingedly secured by pins 48 and 50 to tabs 52 and 54, respectively, that constitute integral parts of the base 44. The lid is adapted, when rotated to contact the top surface of the base 44, to maintain a mounted chip carrier firmly in place in the illustrated socket assembly. For that purpose, the lid 46 comprises a recess 56 that includes a pedestal 58. When the lid is closed and retained in place by clip 60, the pedestal 58 presses down on the back side of the mounted carrier 26. This serves to maintain the aforespecified outer terminal portions on the top side of the carrier 26 in secure electrical engagement with cantilevered terminal members included in the base 44 of the depicted socket.

Illustratively, the lid 46 and the base 44 of the hereinconsidered socket assembly are made of a rigid plastic material. Numerous such materials exhibiting good mechanical and electrical insulating properties are well known in the art.

The base 44 of the socket assembly shown in FIG. 3 includes a recess 62 whose dimensions are slightly larger than the corresponding dimensions of a chip carrier to be mounted therein. In one specific illustrative embodiment, the recess 62 is framed by a ledge portion 64.

Illustratively, the recess 62 in the base 44 of FIG. 3 includes an opening 66. This opening serves as an air passage for facilitating cooling of a mounted chip carrier. When the depicted socket assembly is mounted in place on a printed-circuit board, the bottom of the base 44, and thus also the bottom of the opening 66, are designed to be spaced apart from the surface of the printed-circuit board. In that way, space for air circulation to cool the chip carrier is provided.

The ledge portion 64 shoen in FIG. 3 includes protuberances 65, 67 and 69 at three of its four inner corners. These protuberances are designed to mate with the aforementioned cut-out regions formed on three of the four corners of the chip carrier 26. Accordingly, the carrier 26 is adapted to be properly registered and mounted on the cantilevered terminal members in only one specified orientation.

The aforementioned cantilevered terminal members shown in FIG. 3 extend into the recess 62 from the inner four vertical walls of the ledge portion 64. (Reference numeral 68 in FIG. 3 designates one such terminal member.) In the specific illustrative case in which the chip carrier 26 includes thirty-three spaced-apart outer terminal portions along each top-side edge, thirty-three spaced-apart terminal members extend from each inner vertical wall of the ledge portion 64. Each such terminal member is designed to contact a respective one of the outer terminal portions on the top-side of the chip carrier 26 when the carrier is mounted in the depicted socket assembly. These terminal members constitute the sole support for a mounted carrier.

Advantageously, each of the cantilevered terminal members included in the socket assembly of FIG. 3 constitutes one free end of a length of gold-plated stainless steel wire. In one specific illustrative embodiment, the wire has a circular cross-section approximately 0.23 mm in diameter.

Figure 4:
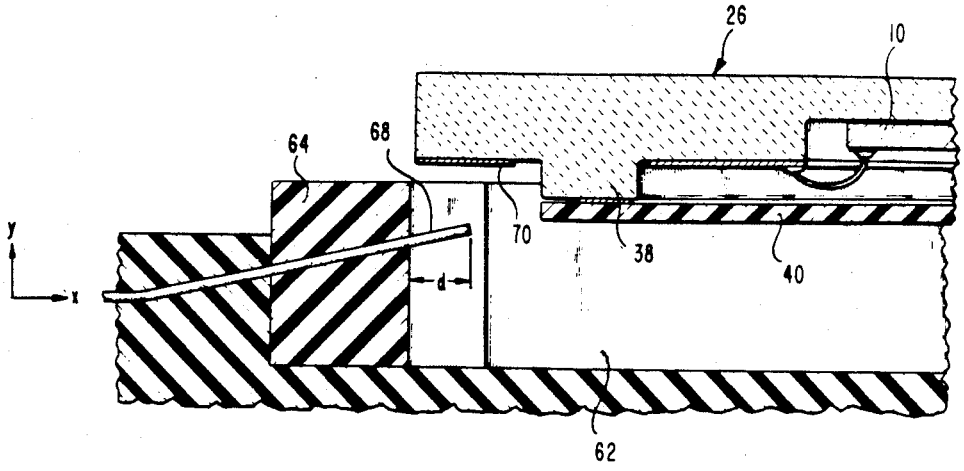
FIGS. 4 and 5 are side views of a portion of the FIG. 3 assembly.

FIG. 4 is a cross-sectional depiction that shows one such cantilevered terminal member 68 extending into the recess 62 from one vertical side wall of the ledge portion 64. Before being contacted by the chip carrier 26, the terminal member 68 is upwardly inclined at an angle of, for example, approximately 12.5 degrees with respect to a line parallel to the X axis. Illustratively, the terminal member 68 extends into the recess 62 from the indicated side wall of the portion 64 by a distance d that in one specific enbodiment was about 5.75 mm.

Advantageously, the right-hand end of the terminal member 68 shown in FIG. 4 is cut off square. In other words, the planar end surface of the terminal member 68 is perpendicular to the main longitudinal axis of the member 68. In that way, the upper right-hand portion of the end of the member 68 provides a sharp edge for intimate scraping and even slightly penetrating contact with an associated one of the outer terminal portions of the chip carrier 26. In FIG. 4, the conductive terminal portion of the carrier 26 intended to be contacted by the terminal member 68 is designated by reference numeral 70.

Figure 5:
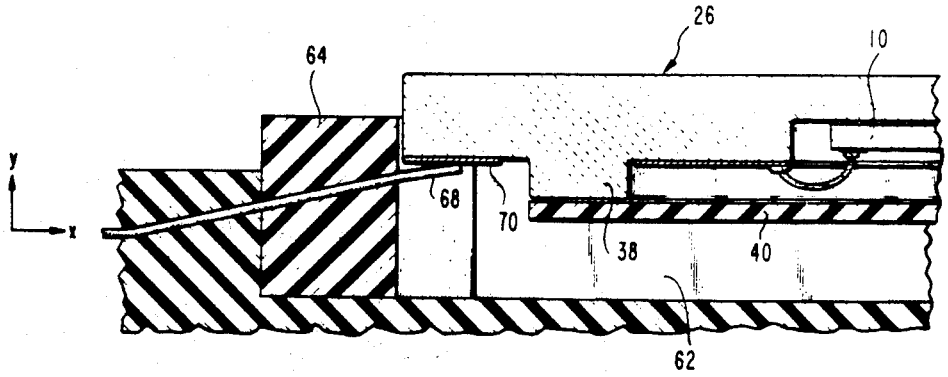

FIG. 5 shows a portion of the chip carrier 26 in its final mounted position in applicant's unique socket assembly. As depicted, the terminal member 68 is in intimate electrical contact with the terminal portion 70 of the carrier 26. In the indicated position, all the other cantilevered terminal members extending from the ledge portion 64 are similarly established in intimate electrical contact with respective ones of the outer terminal portions included on the chip carrier 26. The chip 10 is thereby securely mechanically mounted and electrically connected in an effective manner to the socket assembly described herein.

With the chip carrier 26 in its final mounted position in the socket assembly, as indicated in FIG. 5, the cantilevered terminal member 68 is still upwardly inclined. But the angle between the main longitudinal axis of the member 68 and a line parallel to the X axis is, for example, about 8 degrees less than the 12.5-degree angle specified above for the quiescent case (FIG. 4) in which the carrier 26 is not yet in contact with the terminal member 68. In the contacting position represented in FIG. 5, the end of the member 68 exerts a resilient upward force on the terminal portion 70.

Figure 6:
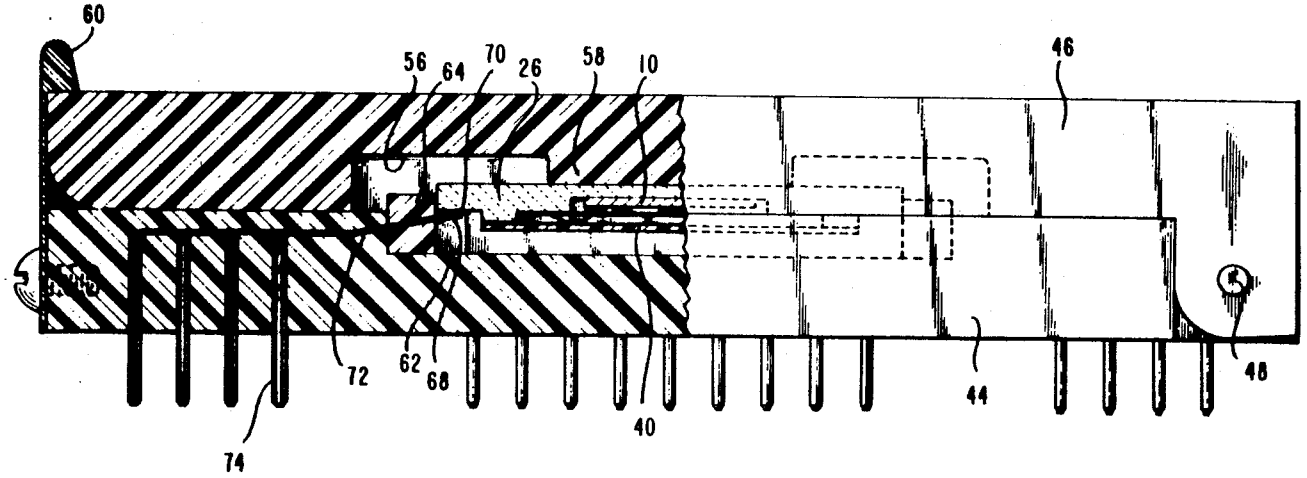
FIG. 6 is a side view, partially broken away, of the FIG. 3 assembly with the chip-containing carrier mounted therein.

The terminal member 68 depicted in FIG. 5 is also shown in the more complete view designated FIG. 6. The member 68 and each of the other cantilevered members specified herein constitute the free movable ends of conductors that are rigidly retained in the base 44 of the FIG. 6 socket assembly. Thus, as shown in FIG. 6, the terminal member 68 constitutes one end of a conductor 72 whose other end extends through and beyond the bottom surface of the base 44.

The conductor ends that extend from the bottom surface of the base 44 are designed to be inserted into a standard female receptacle on a printed-circuit board. In some cases of practical importance, it is advantageous to impart additional size and rigidity to these conductor ends. In such cases, lengths of gold-plated stainless-steel tubing, for example, can be bonded to these conductor ends with a suitable adhesive such as silver epoxy cement. Such lengths of tubing, including tubing 74 around the lower end of the conductor 72, are shown in FIG. 6.

The novel socket assembly described herein is adapted for mounting a flat-pack-packaged chip on a printed-circuit board. The assembly provides a reliable mechanical and electrical interface between the packaged chip and the board. The assembly can be disengaged from the board and, significantly, the packaged chip can be quickly and easily removed from the socket assembly. As a consequence, development, testing and repair of such an assemblage of components are greatly facilitated.

Finally, it is to be understood that the above-described arrangements are only illustrative of the principles of the present invention. In accordance with these principles, numerous modifications and alternatives may be devised by those skilled in the art without departing from the spirit and scope of the invention. For example, although emphasis herein has been directed to mounting only a single chip on the bottom of the recessed portion 28 of the carrier 26 (FIG. 1), it is feasible to mount and interconnect plural chips directly on the bottom of the portion 28. Further, in some cases of practical importance it is advantageous to mount one or more chips on a subcarrier which in turn is mounted on the bottom of the recessed portion 28.

What is claimed is:

1. Apparatus for electrically interconnecting an integrated-circuit chip to a printed-circuit board, said apparatus comprising a flat-pack board having a multiple-pad integrated-circuit chip mounted on the topside of said flat-pack board, first electrical conductors on the topside of said flat-pack board, said conductors including inner terminal portions adjacent said mounted chip and outer terminal portions disposed along the perimeter of said flat-pack board, means electrically connecting the pads on said chip to respective ones of said inner terminal portions, a socket assembly comprising a base having a recess formed in the topside thereof, second electrical conductors mounted in said base and having inner terminal elements extending into the recess in said base around the perimeter of said recess and outer terminal elements extending from said base and adapted to be inserted into a female connector on a printed-circuit board, said inner terminal elements constituting topside-inclined cantilevered elements extending from the side walls defining the recess in said base, said cantilevered elements being adapted to respectively contact the outer terminal portions of said flat-pack board when the topside of said flat-pack board is positioned on said cantilevered elements, and a lid member, constituting a part of said socket assembly, adapted to be positioned in contact with said base for exerting force on the bottomside of said flat-pack and thereby causing the still inclined but slightly depressed cantilevered elements to establish stable electrical connections with said outer terminal portions.

2. Apparatus as in claim 1 wherein each inclined cantilevered element comprises a planar end surface perpendicular to the main longitudinal axis of the element thereby providing a sharp upper edge on said element for engagement with its respective outer terminal portion.

3. Apparatus as in claim 2 wherein said cantilevered elements comprise gold-plated stainless-steel wires.

4. Apparatus as in claim 3 further including means for retaining said lid on said base in a secure mechanical manner.

5. A socket assembly comprising a base having a recessed portion formed in the top surface thereof, said recessed portion being bounded by a sidewall, the cross-sectional dimensions of said recessed portion being slightly larger than the corresponding dimensions of a chip package to be placed in said recessed portion, conductors in said base including cantilevered elements extending from said sidewall into said recessed portion and quiescently inclined upwards towards said top surface, said conductors also including terminal elements extending from said base and adapted for insertion into a socket on a printed-circuit board, and lid means adapted to mate with the top surface of said base and to exert a force on a chip package placed in said recessed portion on said cantilevered elements to establish respective electrical contact between said cantilevered elements and contact regions on said chip package.

6. An assembly as in claim 5 wherein each of said cantilevered elements comprises a planar end surface perpendicular to the main longitudinal axis of the element thereby providing a sharp upper edge on said element for engagement with its respective contact region on said chip package.

7. An assembly as in claim 6 wherein said cantilevered elements are still inclined upwards towards said top surface but slightly depressed relative to their quiescent inclinations when the lid means mates with said base and exerts a force on the chip package placed in said recessed portion.

8. An assembly as in claim 7 wherein said lid means is hingedly mounted on said base and adapted to be mechanically retained in place on said base when said lid means mates with the top surface of said base.

9. An assembly as in claim 8 wherein said cantilevered elements comprise gold-plated stainless-steel wires.

* * * * *